United States Patent
Happ et al.

(10) Patent No.: US 7,414,257 B2
(45) Date of Patent: Aug. 19, 2008

(54) SWITCHING DEVICE FOR CONFIGURABLE INTERCONNECT AND METHOD FOR PREPARING THE SAME

(75) Inventors: Thomas D. Happ, Pleasantville, NY (US); Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 262 days.

(21) Appl. No.: 10/812,991

(22) Filed: Mar. 31, 2004

(65) Prior Publication Data
US 2005/0219800 A1   Oct. 6, 2005

(51) Int. Cl.
*H01L 29/72* (2006.01)

(52) U.S. Cl. .............................. 257/2; 257/530; 257/774

(58) Field of Classification Search ...................... 257/2, 257/530
See application file for complete search history.

(56) References Cited

U.S. PATENT DOCUMENTS 5,761,115 A * 6/1998 Kozicki et al. .............. 365/182
6,348,365 B1 * 2/2002 Moore et al. ................ 438/130
2005/0127524 A1 * 6/2005 Sakamoto et al. ........... 257/774

FOREIGN PATENT DOCUMENTS

DE    100 01 852 A1   7/2001
EP    1 501 124 A1    1/2005

* cited by examiner

*Primary Examiner*—Edward Wojciechowicz
(74) *Attorney, Agent, or Firm*—Slater & Matsil, L.L.P.

(57) ABSTRACT

The present invention relates to a switching device to be irreversibly switched from an electrically isolating off-state into an electrically conducting on-state for use in a configurable interconnect, comprising two separate electrodes, at least one of which being a reactive metal electrode, and a solid state electrolyte arranged between said electrodes and being capable of electrolyte isolating said electrodes to define said off-state, said electrodes and said solid state electrolyte forming a redox-system having a mini-mum voltage ("turn-on voltage") to start a redox reaction, the redox reaction resulting in the generation of metal ions to be released into said solid state electrolyte, the metal ions being reduced to increase a metal concentration within said solid state electrolyte, wherein an increase of said metal concentration results in a conductive metallic connection bridging the electrodes to define the on-state.

24 Claims, 6 Drawing Sheets

FIG 1
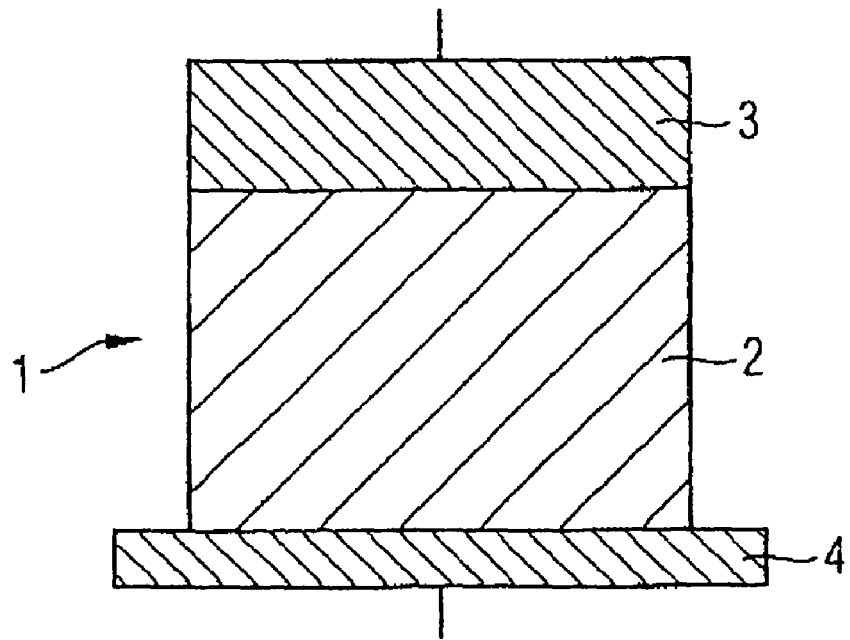
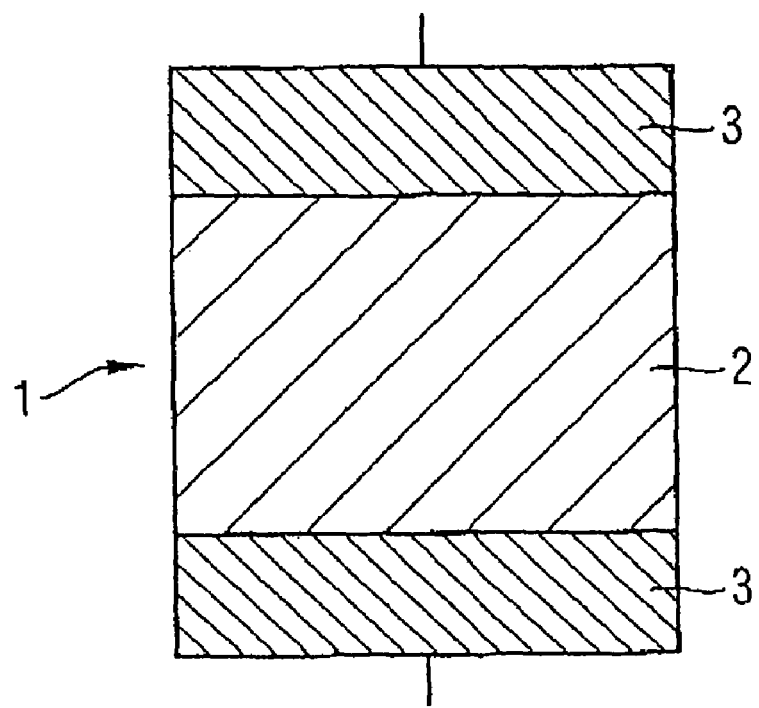

FIG 2
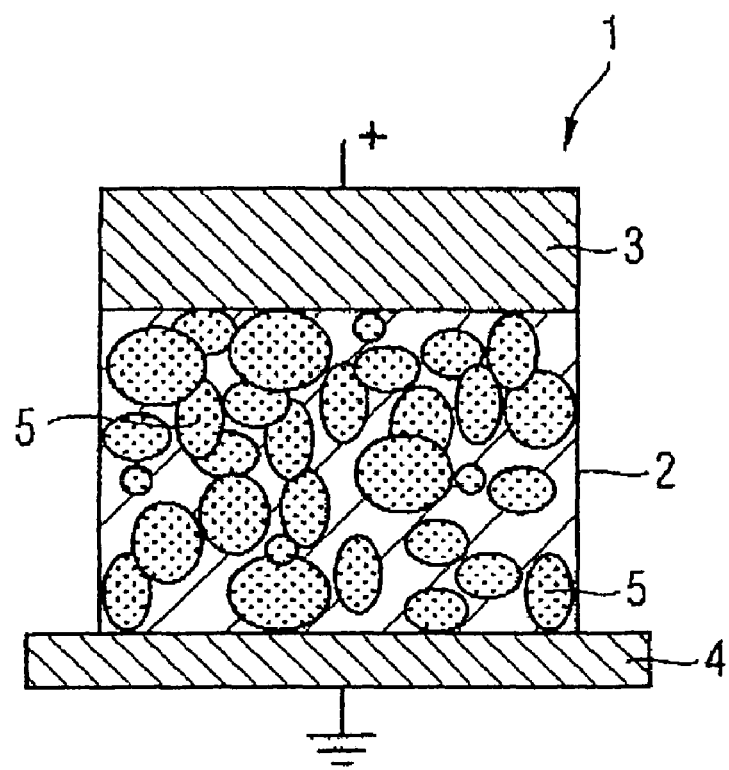
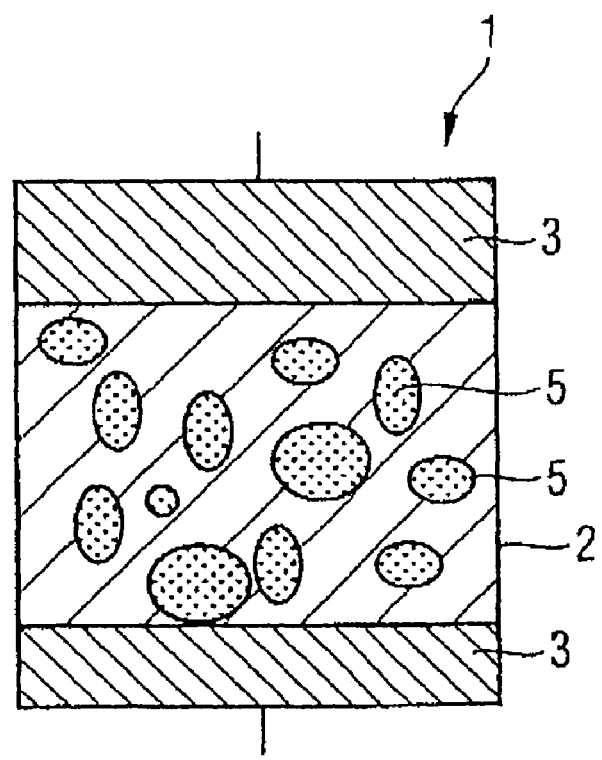

FIG 4
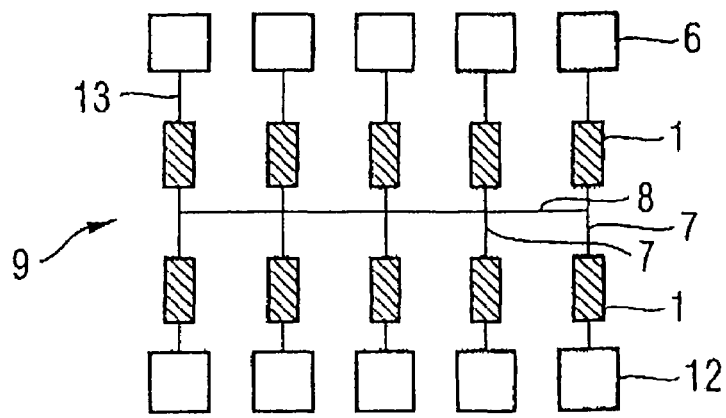
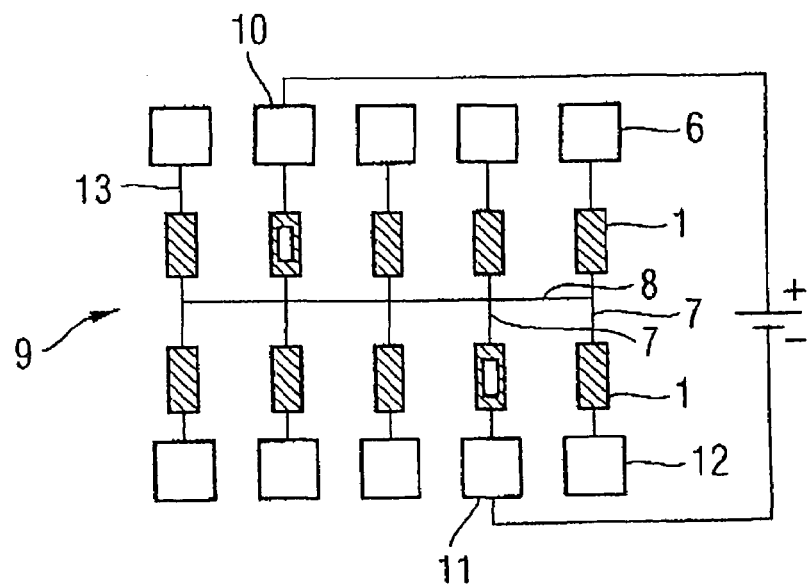
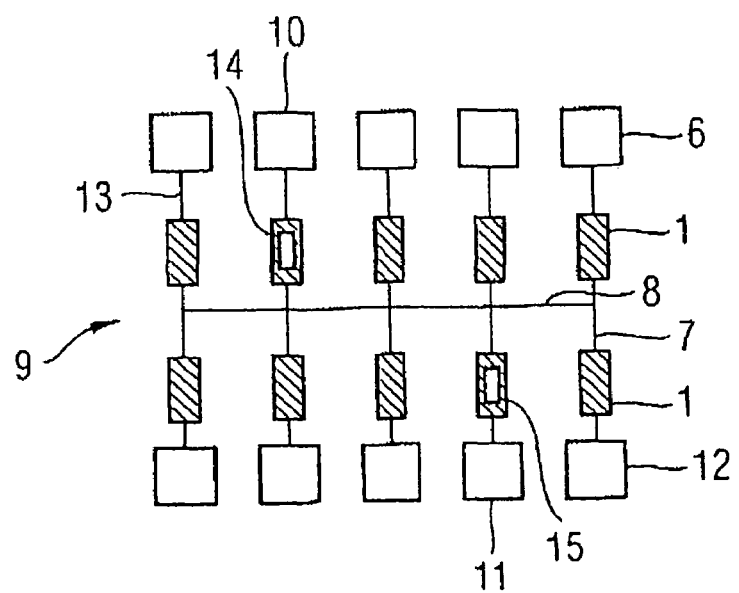

FIG 5
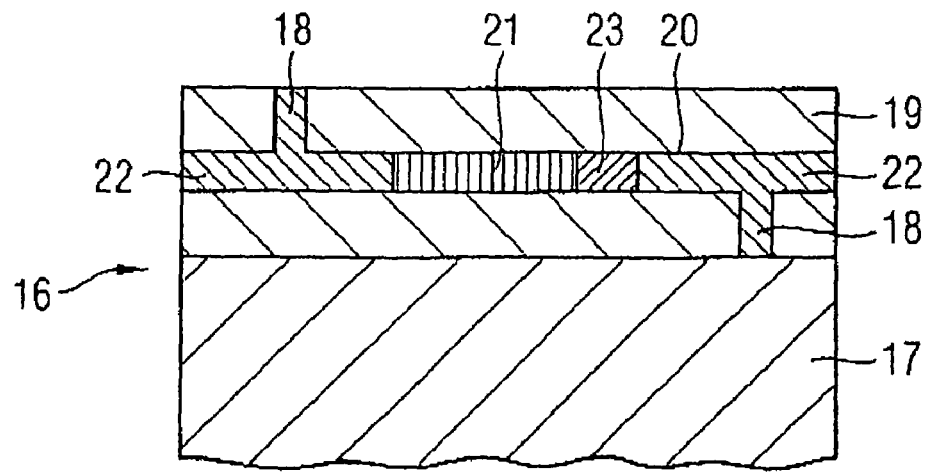
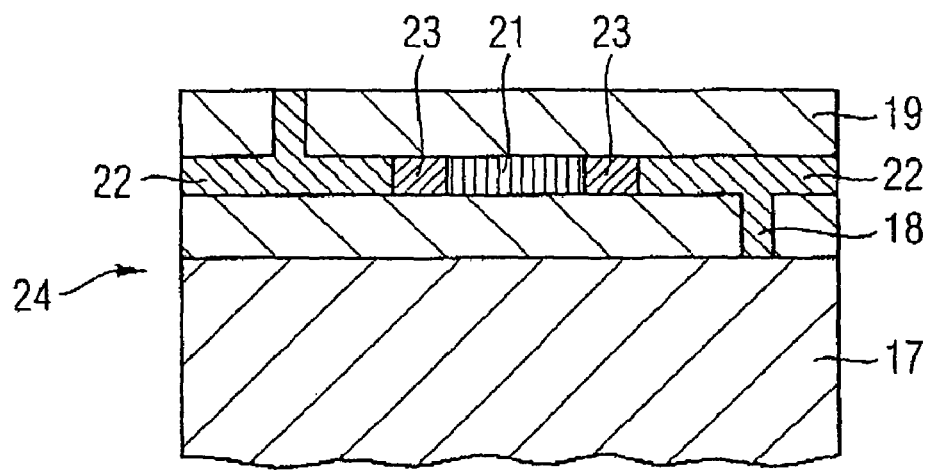
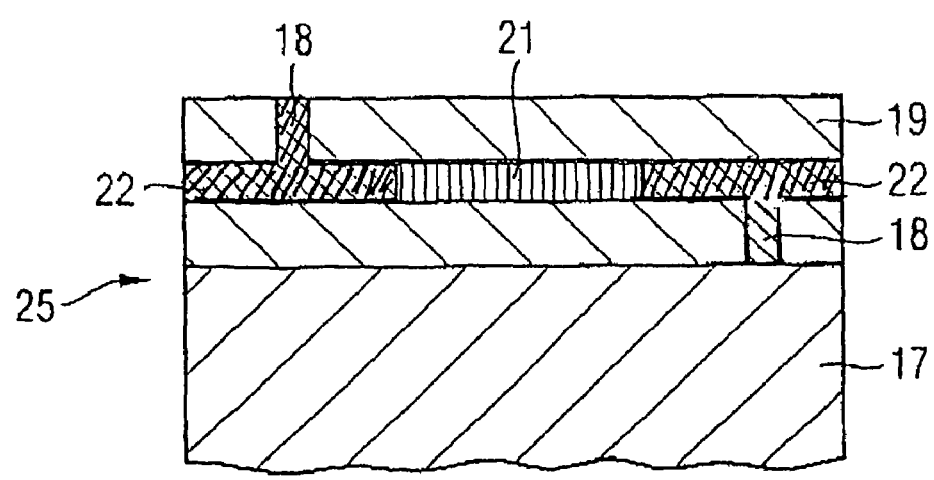

FIG 6
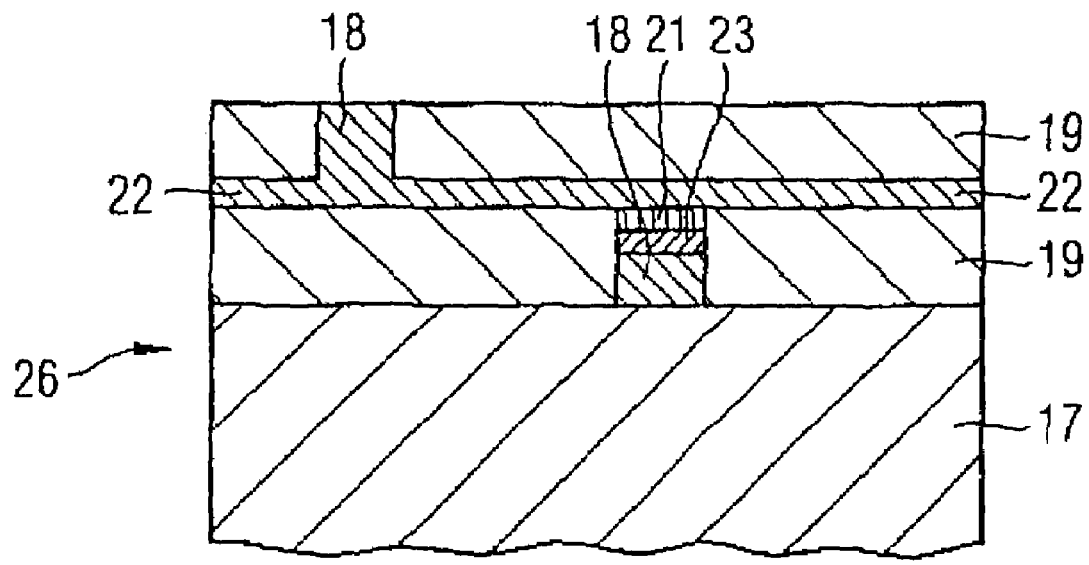
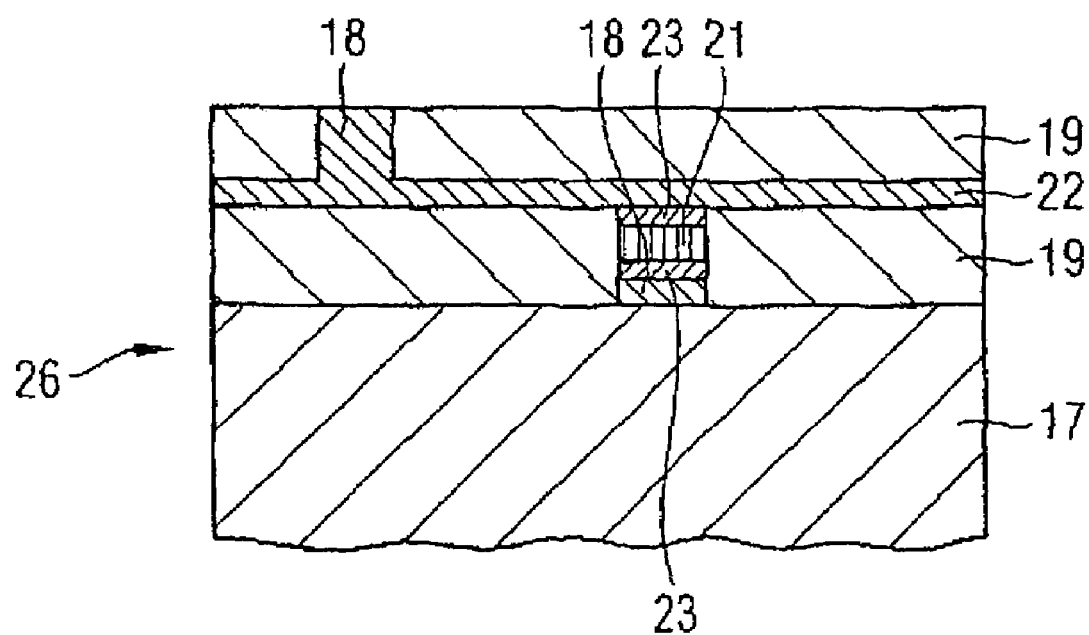

SWITCHING DEVICE FOR CONFIGURABLE INTERCONNECT AND METHOD FOR PREPARING THE SAME

BACKGROUND

1. Field

The invention relates to a switching device, and more particularly, a switching device that can be switched from an electrically isolating "off-state" into an electrical conducting "on-state" for use in a configurable interconnect, configurable electrical conductor network, configurable integrated circuit, or the like.

2. Background Information

Modern integrated circuit chips contain millions of transistors, which are easily connected by metals, which most conveniently are chosen to be copper, aluminium, or aluminium-based alloys. From a circuit design point of view, it would be highly desirable if at least some of these circuit connections could be "flexible routed" in order to allow a desired flow of electrical signals. Such user-configurable electrical connectors could be used to enable or turn off certain parts of a chip to customize its behavior to a specific application.

For example, chips could be manufactured in a test mode, in which it-is made possible to verify its functionality, while after successful testing of the chips, such test mode may be turned off, so that chips are ready for operation. Another important application of flexible routing of configurable electrical connections is given by redundancy activation of memory products.

For certain applications, especially as far as safety aspects are concerned, for instance in the case of smart cards, it may be highly desirable to route circuit connections once only. For that purpose, it is known to use fuse or anti-fuse technologies, which are based on the provision of dedicated paths, which have been irreversibly rendered conductive or non-conductive.

Conventional fuse technology involves the thermal disintegration of a metal conductor patch for conducting separate circuits, which conducting path disintegration, for example, is effected by an optical heating method or a focused laser beam. Fuse technology therefore demands an unobstructed view of the chip top surface, which requires to open any insulation or top cover material, thus rendering any post-packaging routing impossible. Moreover, optical fuses are comparably large-sized, which, however, is detrimental to the increasing demand for miniaturization of modern integrated circuit chips.

Conventional anti-fuse technology, which is most frequently used in modern chip technology, involves the irreversible electrical breakdown of a thin electric layer for isolating separate circuits by applying high voltage pulses. Anti-fuses, however, have the problem that electrical conductivity, and hence reliability, of the burned path is not as high as a real metallic interconnect. Furthermore, the rupturing of such anti-fuses requires the application of relatively high voltage pulses, which typically are in the range of 6 V to 15 V. However, downscaling of these voltages causes problems, since this would require ultra-thin, high-quality oxide layers and thus demands additional processing and particular integration efforts.

SUMMARY

Embodiments in accordance with the present invention have been achieved in view of the above problems, or for realization of other advantages. An electrically switching device is disclosed that is relatively small in size, easy to apply and reliable in use, and does not require an unobstructed view of the chip top surface to route circuit connections, so that configuration even after packaging of the device is enabled.

A switching device is disclosed that can be irreversibly switched from an electrically isolating off-state into an electrically conducting on-state for use in a configurable interconnect. The device includes two separate electrodes, at least one of which being a reactive metal electrode. The device also includes a solid state electrolyte arranged between the electrodes and being capable of electrically isolating said electrodes to define said off-state. The electrodes and the solid state electrolyte form a redox-system having a minimum voltage to start a redox-reaction, the redox-reaction resulting in the generation of metal ions to be released into the solid state electrolyte, and the metal ions being reduced to increase a metal concentration within the solid state electrolyte. An increase of the metal concentration results in a conductive metallic connection bridging the electrodes to define the on-state.

A configurable electrical interconnect, a configurable conductive network, and a configurable integrated circuit, all comprising at least one switching device as described above, are also described, as well as methods for preparing each of the same.

The invention is explained in more detail below with reference to diagrammatic drawings on the basis of preferred exemplary embodiments of the methods according to the invention.

BRIEF DESCRIPTION OF THE DRAWINGS

The invention is explained in more detail below with reference to the appended drawings, in which, in detail:

FIG. 1 is a schematic illustration of the layout of a switching device in accordance with a first and a second embodiment of the switching device of the invention.

FIG. 2 is a schematic illustration of embodiments of FIG. 1, having metal precipitates produced by applying voltage.

FIG. 4 is a schematic diagram of a configurable conductor network using switching devices according to an embodiment of the conductor network of the invention.

FIG. 5 is a schematic diagram of a configurable integrated circuit using horizontally-realized switching devices according to three different embodiments of the integrated circuit of the invention.

FIG. 6 is a schematic diagram of a configurable integrated circuit using vertically realized switching device according to two further embodiments of the integrated circuit of the invention.

DETAILED DESCRIPTION

Figure 3:
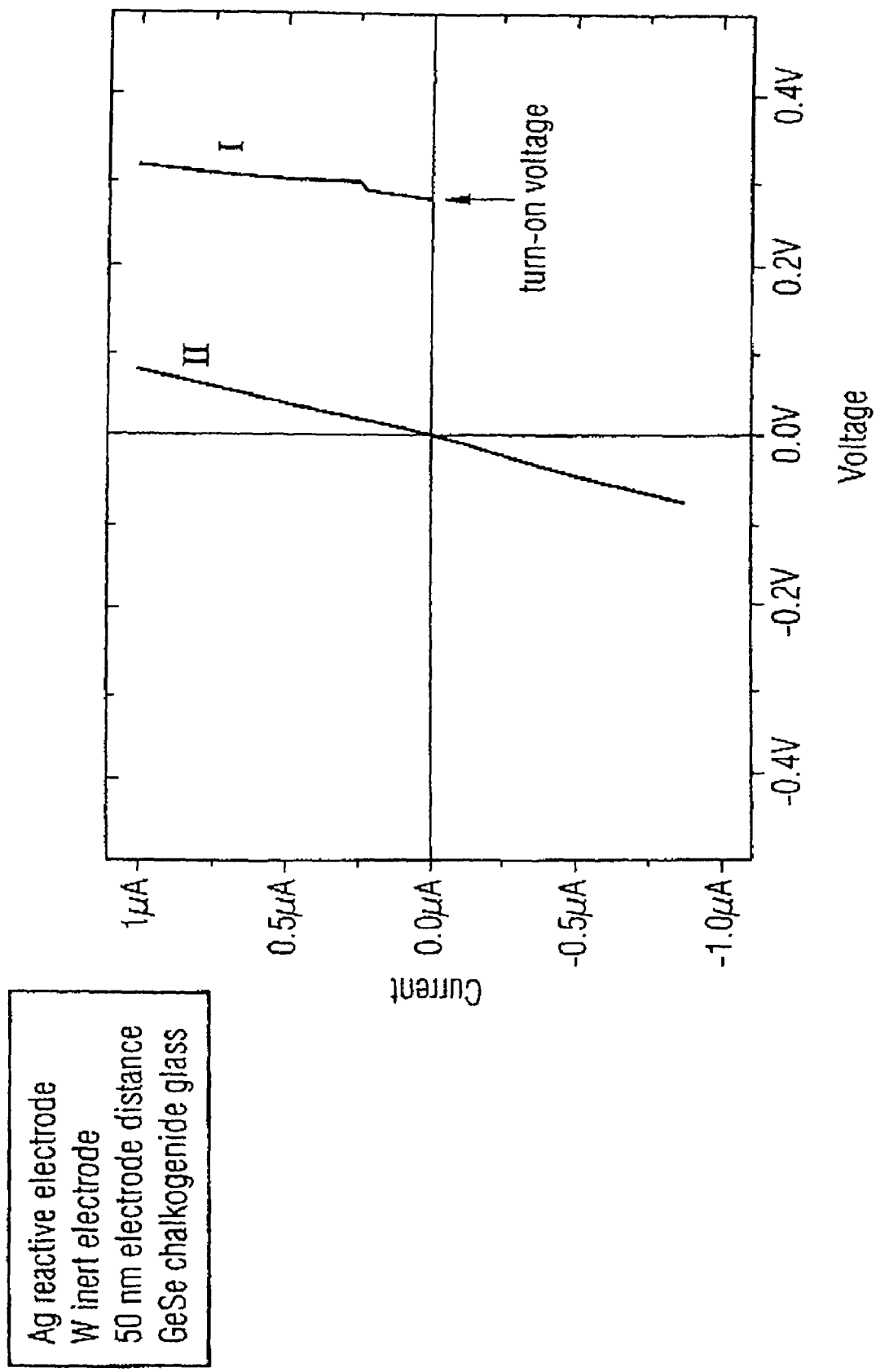
FIG. 3 is a schematic diagram showing a typical switching characteristic of the switching device according to the invention.

Embodiments of the present invention will be described in detail below with reference to the accompanying drawings.

FIG. 1 shows a schematic structure of the layout of a switching device according to two different embodiments of the invention. A first embodiment of the switching device 1, which is shown in the upper diagram of FIG. 1, comprises a porous solid state electrolyte host material 2, such as a porous chalcogenide glass, for example GeSe or GeS, a reactive metal electrode 3, for example Cu, Ag, Au or Zn, and an inert electrode 4, for example WTi, Ta, TiN, doped Si or Pt. The host material is sandwiched between both electrodes, such that the solid state electrolyte 2 and reactive metal electrode 3 together form a redox-system defining a redox-potential. In case a potential more positive than the above redox-potential is applied on the reactive metal electrode 3, redox-reaction starts and metal ions are driven into the solid state electrolyte host material 2.

A second embodiment of the switching device 1, which is shown in the lower diagram of FIG. 1, comprises a porous host material, such as a porous chalcogenide glass 2, for example GeSe or GeS, as well as two reactive metal electrodes 3, for example Cu, Ag, Au or Zn. The second embodiment of the switching device according to the invention shown in FIG. 1 thus differs from the first embodiment in that the solid state electrolyte 2 is arranged between two reactive metal electrodes.

In the virgin state without application of a voltage to the electrodes, which is shown in FIG. 1, the resistivity of the switching device is high, since the state electrolyte host material is isolating both electrodes.

In a typical configuration of the second embodiment of the switching device both electrodes are chosen to be Ag-electrodes having a thickness of about 50 nm.

The solid state electrolyte is chosen to be a chalcogenide glass, typically GeSe2 having a thickness of about 30 nm. Both electrodes thus are spaced apart to have a distance of about 30 nm.

FIG. 2 is a schematic view showing the first and second embodiments of FIG. 1 having a voltage applied to their electrodes, which at least amounts to the turn-on voltage. As is sketched in FIG. 2, under the influence of the applied volt-age, metal ions are driven into the solid state electrolyte host material 2, which results in the formation of metal precipitates 5, which under continued supply of electrodes will grow in number, density and volume to bridge both electrodes. As can be seen from the upper diagram of FIG. 2, in the case, where one electrode is a reactive metal electrode 3 and the other electrode is an inert electrode 4, a potential more positive than said redox-potential has to be applied to the reactive metal electrode 3 to produce metal ions. Contrary to that, in the case, where both electrodes are reactive metal electrodes 3, the switching can be triggered independently of the turn-on voltage polarity, since either electrode side is capable of releasing metal ions into the solid state electrolyte host material 2.

FIG. 3 is a schematic diagram showing a typical switching characteristic of the switching device according to the invention. As can be seen in the insert, the switching device is comprised of a reactive Ag-electrode, an inert W-electrode and a GeSe chalcogenide host material, wherein both electrodes are spaced apart from each other to have a distance of about 50 nm.

Curve I of FIG. 3 describes a switching characteristic from off to on which involves an increase of the applied voltage to finally reach the turn-on voltage, which approximately amounts to 0,27 V. As can be seen from curve I, no electric current can flow, unless turn-on voltage is reached, i.e. the switching device is switched into its on-state. After having reached turn-on voltage, electron current is enable to flow.

Curve II of FIG. 3 shows a typical current versus voltage characteristic of the switching device of the invention in that case the switching device has already been switched into its on-state.

FIG. 4 is a view showing a schematic structure of a configur-able conductor network using switching devices according to an embodiment of the conductor network of the invention. As can be seen from FIG. 4, the conductor network 9 connects five input ports or subcircuits or the like, to five output ports or subcircuits or the like, wherein each of the input ports/subcircuits 6 has a direct connection 13 to one of the output ports/subcircuits 9, and wherein each direct connec-tion 13 is separated by two interconnected switching devices 1 according to the invention. To interconnect input ports/subcircuits 6 and output ports/subcircuits 12, which are not directly connected by direct connection 13, a back-bone connection 8 between the switching cells 1 is provided. In order to conductively connect certain points of the net-work, a voltage (or current) pulse is applied between the desired input ports/subcircuits 6 and output ports/subcircuits 12 of the conductor network 9, thus switch-ing the switching devices within the respective branches. In the conductor net-work 9 of FIG. 4, each switching device comprises a reactive metal electrode and an inert electrode, so that the switching devices 1 are of the asymmetric type. It thus is important to ensure these switching pulses to have the proper-polarity with the reactive metal electrode more positive than the inert electrode, since only then the switching mechanism is enabled.

As can be seen in FIG. 4, voltage is applied to input port/subcircuit 10 and output ports/subcircuit 11, such that switching device 14 and switching device 15 are switched into their on-states to conductively connect input port/subcircuit 10 and output port/subcircuit 11. Similar to that, every input port/subcircuit 6 may be electrically connected with every output port/subcircuit 12 of the conductor network 9.

FIG. 5 is a view showing schematic structures of configurable integrated circuits using a horizontally realized switching device according to three different embodiments of the inte-grated circuit of the invention.

A first embodiment of the integrated circuit of the invention is shown in the upper schematic diagram 16. In the first embodiment, a switching device according to the invention is integrated in a standard metal line 22 on substrate 17. The standard metal line 22 is electrically connected to the integrated circuit by means of through via 18, both of which are embedded in interlayer dielectric 19. The switching device according to the invention comprises one reactive metal electrode 23 and a solid state electrolyte 21, which are inte-grated in metal line 22. The second electrode is formed by the metal line 22 itself.

In order to prepare the first embodiment of the switching device, an opening in the metal line 22 is created using standard processing techniques, such as lithography, etch, spacer deposition and structuring, chemical-mechanical pol-ishing etc. This metal line opening then is filled with solid state electrolyte material, again be structured and refilled with reactive metal electrode material on one side of the solid state electrolyte.

A second embodiment of the integrated circuit of the invention is shown in the middle schematic diagram 24. The second embodiment differs from the first embodiment in, that two reactive metal electrodes 25 sandwiching the solid state electrolyte 21 are integrated in the metal line 22.

In order to prepare the second embodiment of the switching device, an opening in the metal 22 is created, for example by using above-cited standard processing techniques. This metal line opening then is filled with the solid state electrolyte material, again be structured and refilled with the reactive metal electrode metal on either side of the solid state electrolyte.

A third embodiment of the integrated circuit of the invention is shown in the lower schematic diagram 25. The third embodi-ment differs from the first embodiment in, that the metal line 22 material is chosen to be the same as the reactive electrode material, so that both electrodes are formed by metal line 22.

In order to prepare the third embodiment of the switching device, an opening in the metal line 22 is created using standard processing techniques. This metal line opening is then filled with the solid state electrolyte material, while no further filling with reactive metal electrode material is necessary.

FIG. 6 is a view showing two schematic structures of the configurable integrated circuit using vertically realized switching device according to two further embodiments of the integrated circuit of the invention.

A fourth embodiment of the integrated circuit of the invention is shown in the upper schematic diagram 26. In the fourth embodiment, a switching device according to the invention is integrated in the standard through via 18, connecting different metallization levels of the integrated circuit. The fourth embodiment of the switching device comprises one reactive metal electrode 23 and a solid state electrolyte 21, while the second electrode is formed by the through via 18 itself.

In order to prepare the switching device according to the fourth embodiment of the integrated circuit, a through via opening 18 is created using standard processing techniques, which then is followed by the deposition of the reactive metal electrode material, and the deposition of the solid state electrolyte material from one side of the solid state electrolyte.

A fifth embodiment of the integrated circuit of the invention is shown in the lower diagram 27. The fifth embodiment differs from the fourth embodiment in, that two reactive metal electrodes 23 sandwiching the solid state electrolyte 21 are integrated in the through via 18.

In order to prepare the fifth embodiment of the switching device, a through via opening 18 is created using standard processing techniques. Then, the reactive metal electrode material is deposited and, after that, the solid state elec-trolyte material is deposited.

Similar to embodiment three of the integrated circuit, through via 18 material may be chosen to be the same as the reactive electrode material, so that both electrodes are formed by through via 18 (not shown). In order to prepare such switching device, a through via opening 18 is created using standard processing techniques. The through via opening then is filled with the solid state electrolyte material, while no further filling of reactive metal electrode material is necessary.

As to fourth and fifth embodiment of the integrated circuit according to the invention, there can be cap layers/diffusion layers both on top and/or beneath the switching device, depending on the process flow integration requirements.

Metal-enriched solid state electrolyte switching devices offer a conductive bridging of electrodes that allows their use as configurable (pro-grammable) conductor elements in configurable conductor net-works, integrated circuit or the like.

They enable a field programming of circuit connections with—depending on the specific embodiment—either unipolar or bipolar voltage or current pulses. These programming pulses are at a higher amplitude than the desired operating voltage of the circuit, so that disturbance-free operation is ensured. The turn-on voltage (threshold voltage) can be adjusted by tuning of the physics parameters of the switching devices, such as their electrode separation, host material etc.

Therefore, in accordance with an embodiment of the present invention, a switching device may be irreversibly switched from an electrical isolating off-state into an electrical conducting on-state for use in a configurable interconnect. It comprises two separate electrodes for applying a voltage there between, as well as a solid state electrolyte (ion conducting electrolyte) arranged in between the electrodes, which functions as a host material. An electrically conducting state enables the flow of electrons which electrically conducting state thus must be seen different from a ion conducting state, as is basically realized in said solid state electrolyte. For that reason, although being ion conducting, said solid state electrolyte is capable of electrically isolating said electrodes to define said off-state of said switching device.

As provided above, the solid state electrolyte is arranged, for instance sandwiched, in between the electrodes, so that the electrodes abut against the solid state electrolyte in order to enable a redox-reaction (reduction-oxidation reaction), which results in the generation of metal ions.

For this purpose, at least one of the electrodes is chosen to be a reactive metal electrode which metal electrode, along with the solid state electrolyte forms a metal electrode-solid state electrolyte-redox-system having a well-defined redox-potential. Given that a potential, which is chosen to be higher than the redox-potential, is applied to said metal electrode, the electrode metal is oxidized to produce metal ions, which are driven into said solid state electrolyte. The redox-potential thus defines a minimum voltage, which conveniently is designated as turn-on voltage, to be applied to both electrodes to start the redox-reaction. The turn-on voltage itself depends on a variety of further characteristics, as for instance the spatial distance of the electrodes.

A reactive metal electrode (metal ion donor electrodes) is seen to be capable of supplying metal ions, in case a voltage higher than or at least equal to said turn-on voltage is applied to both electrodes. Contrary to that, an inert elec-trode is defined as not being capable of supplying metal ions, in case above-characterized voltage is applied to the electrodes, i.e. an inert electrode is chosen to have a redox-potential, which is higher than that of said reactive metal electrode and furthermore does not chemically react with said solid state electrolyte.

By applying a voltage across the electrodes, which at a minimum amounts to said turnon voltage, produced metal ions are driven into said solid state electrolyte and then will be reduced to form metallic precipitates. Continued supply of metal ions into the solid state electrolyte will then result in an increase of metal concentration within said solid state electrolyte, so that said metallic precipitates grow in number, density and volume until they finally reach each other and form a conductive metallic connection bridging said electrodes, to define said on-state of the switching device. Such difference in conductivity between said electrically conductive on-state and said electrically isolating off-state of the switching device according to the invention usually amounts to several orders of magnitudes.

According to one or more embodiments of the invention, both electrodes can be chosen to be reactive metal electrodes. Alternatively, it is possible to choose only one of said electrodes to be a reactive metal electrode while the other one is chosen to be an inert electrode. In the latter case, however, the metal precipitates within the solid state electrode to form a metal layer adjacent to the inert electrode to enable the inert electrode to behave as a reactive metal electrode. Such metal layer usually will form in case a sufficiently high concentration of metallic precipitates is provided for. Ordinarily, metal precipitates will enrich at the counter electrode (cathode), since decharging of metal ions is likely to take place in the vicinity of the counter electrode.

In the case, where both electrodes are reactive metal electrodes and in the case where one electrode is a reactive metal electrode and the other one is an inert electrode in combination with an adjacent metal layer, the switching device may not be re-switched from its on-state into its off-state since a change of polarity of the voltage will merely result in a further release of metal ions into said solid state electrolyte and thus will improve conductivity of the switching device. However, in the case where one electrode is chosen to be a reactive metal electrode and the other one is chosen to be an inert electrode, a unipolar turn-on voltage is required for switching the switching device from off to on. In that case, where both electrodes are chosen to be reactive metal electrodes the restriction to a unipolar turn-on voltage is lifted and a bipolar turn-on voltage may be applied. It is preferable that the turn-on voltage of an inert electrode is above 20 V. Accordingly, said inert material may be chosen from, however, is not limited to W, Ti, TiN, Ta, TaN, Ir, IrO, doped Si and Pt.

The present invention offers a new approach to configure an electrical interconduct in using a switching device. The switching device according to the invention may be easily manufactured, its switching is realized in a very easy manner by applying appropriate volt-age to the electrodes, and it is very reliable in use because of its stable metallic bridge made up of metallic precipitates between both electrodes. Further, since said turn-on voltage is used to switch the device from its off-state into its on-state, no unobstructive view to the device top surface is required, thus rendering post-packaging routing possible, for instance to repair back end fails.

According to the invention, it is preferred, that the turn-on voltage for activation of said redox-system, i.e. start of said redox-reaction to produce metal ions at the anode-side electrode, is atmost 20 V. It even more is preferred that said turn-on voltage is atmost 10 V and is furthermore preferred, that said turn-on voltage is atmost 2 V. It is mostly preferred, that said turn-on voltage is below 1 V and said turn-on voltage may typically lie in the range of between 200 and 500 mV. The present invention thus offers an advantage over prior art anti-fuse technology, in which typically volt-age pulses as high as 6 to 15 V are used for break-down of the dielectric layer, as above-described.

Accordingly, said reactive metal electrode material may for instance be selected from, however is not limited to, Cu, Ag, Au, Al, Na, K, Ca, Mg and Zn.

Since the rate of metal ion diffusion into said solid state electrolyte depends from the applied voltage, said turn-on voltage has to be chosen care-fully, which directly scales up with increasing distance of said electrodes. A small electrode distance in the range of from 50 to 100 nm typically may result in turn-on voltages in the range of from 0.3-1 V.

While, in general, any solid state electrode may be envisaged for use in the present invention, it nevertheless will be preferable, that the solid state electrolyte is chosen to be a glassy material, which advantageously is a porous chalcogenide glass, such as GeSe, GeS, AgSe or CuS. Further, said solid state electrolyte may advantageously be chosen to be a porous metal oxide, such as WOx or Al2O3.

Further, according to the invention it may be preferable that said solid state electrolyte is background doped with at least one metal, which preferable is chosen to be the same metal as said reactive metal electrode material. Due to that background doping, necessary time to establish a metallic connection to bridge both electrodes may advantageously be reduced, since, vividly spoken, only interstitial regions between adjacent doped background metal precipitates need to be filled. Background metal doping of said solid state electrolyte thus makes it possible to reduce the time, which it takes to switch the switching device from its off-state into its on-state, i.e. response time of the switching device. In background doping said host material, care must be taken to not compromise the isolating capability of the solid state electrolyte.

Said electrodes of the switching device according to the invention preferably are spaced apart to have a distance lying in the range of from 10 nm to 250 nm. It even more is preferred, that said distance lies in the range between 20 nm to 100 nm, and typically amounts about 50 nm.

The switching device according to the invention may be used in a configurable conductor network, which conductor network is comprised of interconnections between certain elements, for instance input/output ports or subcircuits or the like.

Further, the switching device according to the invention may advantageously be used in a configurable integrated circuit. Such configurable circuit may have at least one metallization with at least one metal line, in which case it may be preferable to integrate at least one of said switching devices in said metal line. The configurable integrated circuit may also comprise at least two different metallizations, wherein said metallizations being connected by at least one through via. In the latter case, it may be preferable to integrate at least one of said switching devices in said through via, which has the advantage that by controlling solid state electrolyte thickness, a very fine control of the electrode separation and thus the switching voltages of the switching device is easily achieved. Further, the footprint of the switching device integrated in the through via is very small, allowing a very dense integration. In any case, the reactive electrode material can be either placed on the one or the other side of the solid state electrolyte, or may be placed on both sides of the solid state electrolyte, in case two reactive metal electrodes are aimed at.

The process of preparing the switching device in above configurable integrated circuit in the case, where the switching device has only one reactive metal electrode and one inert electrode, may comprise the steps of creating a first metal line opening and filling said first metal line opening with said solid state electrolyte, creating a second metal line opening and filling said second metal line opening with said reactive metal electrode material, and creating a third metal line opening and filling said third metal line opening with said inert electrode material.

In a case where both electrodes of the switching device are chosen to be reactive metal electrodes, above process is modified by filling said third metal line opening with said inert electrode material. In that case, it is preferred that said second and third metal line openings are simultaneously created and, also, that said second and third metal line openings are simultaneously filled.

The process of preparing the switching device in above configurable integrated circuit in the case, where the switching device has only one reactive metal electrode and one inert electrode, may further comprise the following successive steps of creating at least one through via opening, depositing said reactive metal electrode material, depositing said solid state electrolyte, and depositing said inert electrode material. Alternatively, in that order, said inert electrode material, said solid state electrolyte and said reactive metal electrode material may deposited. After said deposition steps structuring of the deposited layer may be effected.

According to the invention it may be of an advantage, that said metal line material of said integrated circuit is chosen to be the same as said reactive metal electrode material. Similar to that, said through via material may be the same as said reactive metal electrode material. In that case, the process of preparing the switching device in the integrated circuits is facilitated, since in a case, where both electrodes are reactive metal electrodes, process steps are reduced to creating a single metal line/through via opening and filling said single metal line/through via opening with said solid state electrolyte, while in a case where one electrode is a reactive metal electrode and the other one is an inert electrode, process steps are reduced to creating a first metal line opening and filling said first metal line opening with said solid state electrolyte, and creating a second metal line opening and filling said second metal line opening with said inert electrode material, and creating a single through via opening, depositing said solid state electrolyte, and depositing said inert electrode material.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. A switching device having an electrically isolating off state and an electrically conducting on-state, comprising:
    two separate electrodes, at least one of which being a reactive metal electrode; and
    a solid state electrolyte arranged between the electrodes and in said off-state electrically isolating said electrodes, wherein the at least one reactive electrode and the solid state electrolyte form a redox-system having a redox potential defining a minimum turn-on voltage to staff a redox-reaction, the redox-reaction resulting in an oxidization of the electrode metal and thereby the generation of metal ions which are released into the solid state electrolyte and therein reduced to form metallic precipitates which upon continued supply of metal ions increase a metal concentration within the solid state electrolyte and finally form an irreversible conductive metallic connection bridging the electrodes and enabling a flow of electrons between the electrodes to define the on-state.

2. The device according to claim 1, wherein the turn-on voltage is at most approximately 20 V.

3. The device according to claim 1, wherein the turn-on voltage is at most approximately 1 V.

4. The device according to claim 1, wherein the reactive metal electrode material is selected from a group consisting of Cu, Ag, Au, Al, Na K, Ca, Mg and Zn.

5. The device according to claim 1, wherein one of the electrodes is an inert electrode and wherein metal precipitates within the solid state electrolyte from a metal layer adjacent to the inert electrode to enable the inert electrode to act as a reactive metal electrode.

6. The device according to claim 5, wherein the inert electrode material is selected from the group consisting of W, Ti, TiN, Ta, TaN, Ir, IrO, doped Si and Pt.

7. The device according to claim 1, wherein the solid state electrolyte comprises at least one glassy material.

8. The device according to claim 7, wherein the glassy material comprises at least one chalcogenide glass, such as GeSe, GeS, AgSe, or CuS.

9. The device according to claim 1, wherein the solid state electrolyte comprises at least one porous metal oxide, such as $WO_x$ or $Al_2O_3$.

10. The device according to claim 1, wherein the solid state electrolyte is background doped with at least one metal.

11. The device according to claim 10, wherein the background doping metal is chosen to be the same as the reactive metal electrode material.

12. The switching device according to claim 1, wherein the electrodes are spaced apart from each other to have a distance in the range of from 10 nm to 250 nm.

13. A configurable electrical interconnect comprising at least one switching device having an electrically isolating off-state and an electrically conducting on-state and comprising:
    two separate electrodes, at least one of which being a reactive metal electrode; and
    a solid state electrolyte arranged between the electrodes and in said off-state isolating said electrons,
    wherein the at least one reactive metal electrode and the solid state electrolyte form a redox-system having a redox potential defining a minimum turn-on voltage to start a redox-reaction, the redox-reaction resulting in an oxidization of the electrode metal and thereby the generation of metal ions which are released into the solid state electrolyte, and therein reduced to form metallic precipitates which upon continued supply of metal ions increase a metal concentration within the solid state electrolyte and finally form an irreversible conductive metallic connection bridging the electrodes and enabling a flow of electrons between the electrodes to define the on-state.

14. A configurable conductor network comprising at least one switching device having an electrically isolating off-state and an electrically conducting on-state and comprising:
    two separate electrodes, at least one of which being a reactive metal electrode; and
    a solid state electrolyte arranged between the electrodes and in said off-state electrically isolating said electrons,
    wherein at least one reactive metal electrode and the solid state electrolyte form a redox-system having a redox potential defining a minimum turn-on voltage to start a redox-reaction, the redox-reaction resulting in an oxidization of the electrode metal and thereby the generation of metal ions which are released into the solid state electrolyte, and therein reduced to form metallic precipitates which upon continued supply of metal ions increase a metal concentration within the solid state electrolyte and finally form an irreversible conductive metallic connection bridging the electrodes and enabling a flow of electrons between the electrodes.

15. The network according to claim 14, further comprising at least one conductive line for connecting at least two of the switching devices.

16. A configurable integrated circuit comprising at least one switching device having an electrically isolating off state and an electrically conducting on-state and comprising:
    two separate electrodes, at least one of which being a reactive metal electrode; and
    a solid state electrolyte arranged between the electrodes and in said off-state electrically isolating said electrodes,
    wherein at least one reactive metal electrode and the solid state electrolyte form a redox-system having a redox potential defining a minimum turn-on voltage to start a redox-reaction, the redox-reaction resulting in an oxidization of the electrode metal and thereby the generation of metal ions which are released into the solid state electrolyte and therein reduced to form metallic precipitates which upon continued supply of metal ions increase a metal concentration within the solid state electrolyte and finally form a conductive metallic connection bridging the electrodes and enabling a flow of electrons between the electrodes to define the on-state.

17. The configurable integrated circuit according to claim 16, further comprising at least one metallization having at least one metal line, wherein at least one of said switching device is integrated in said at least one metal line.

18. The configurable integrated circuit according to claim 16, wherein a metal line material is the same as a reactive metal electrode material.

19. The configurable integrated circuit according to claim 16, further comprising at least two different metallizations, the metallizations being connected by at least one through via, wherein at least one of said switching devices is integrated in the at least one through via.

20. The configurable integrated circuit according to claim 19, wherein a through via material is chosen to be the same as said reactive metal electrode material.

21. The switching device according to claim 1, wherein only one electrode is a reactive metal electrode and the other electrode is an inert metal electrode in a combination with an adjacent metal layer and wherein the turn-on voltage is unipolar.

22. The configurable electrical interconnect according to claim 13, wherein only one electrode is a reactive metal electrode and the other electrode is an inert metal electrode in a combination with an adjacent metal layer and wherein the turn-on voltage is unipolar.

23. The configurable conductor network according to claim 14, wherein only one electrode is a reactive metal electrode and the other electrode is an inert metal electrode in a combination with an adjacent metal layer and wherein the turn-on voltage is unipolar.

24. The configurable integrated circuit according to claim 16, wherein only one electrode is a reactive metal electrode and the other electrode is an inert metal electrode in a combination with an adjacent metal layer and wherein the 35 turn-on voltage is unipolar.

* * * * *

UNITED STATES PATENT AND TRADEMARK OFFICE
CERTIFICATE OF CORRECTION

PATENT NO.         : 7,414,257 B2                                        Page 1 of 2
APPLICATION NO. : 10/812991
DATED              : August 19, 2008
INVENTOR(S)       : Happ et al.

It is certified that error appears in the above-identified patent and that said Letters Patent is hereby corrected as shown below:

On the Title Page, Section (57) ABSTRACT, line 7, delete "electrolyte" and insert --electrically--.
On the Title Page, Section (57) ABSTRACT, line 9, delete "mini-mum" and insert --minimum--.
In the drawings, Sheet 3, Fig. 3, on the upper left corner, separate small box, 4$^{th}$ line, delete "chalkogenide" and insert --chalcogenide--.
In Col. 1, line 26, after it delete "-".
In Col. 3, line 24, after nm. delete new paragraph return.
In Col. 3, line 33, delete "volt-age" and insert --voltage--.
In Col. 3, line 57, delete "0,27" and insert --27--.
In Col. 3, line 66, delete "figur-able" and insert --figurable--.
In Col. 4, line 6, delete "nec-tion" and insert --nection--.
In Col. 4, line 11, delete "net-work" and insert --network--.
In Col. 4, line 14, delete "switch-ing" and insert --switching--.
In Col. 4, line 19, after proper delete "-".
In Col. 4, line 32, delete "inte-grated" and insert --integrated--.
In Col. 4, line 41, delete "inte-grated" and insert --integrated--.
In Col. 4, line 47, delete "pol-ishing" and insert --polishing--.
In Col. 4, line 67, delete "embodi-ment" and insert --embodiment--.
In Col. 5, line 29, delete "dif-fers" and insert --differs--.
In Col. 5, line 35, delete "elec-trolyte" and insert --electrolyte--.
In Col. 5, line 52, delete "(pro-grammable)" and insert --(programmable)--.
In Col. 5, line 53, delete "net-works" and insert --networks--.
In Col. 6, line 30, delete "elec-trode" and insert --electrode--.
In Col. 7, line 20, delete "volt-age" and insert --voltage--.
In Col. 7, line 30, delete "atmost" and insert --at most--.
In Col. 7, line 31, delete "atmost" and insert --at most--.
In Col. 7, line 32, delete "atmost" and insert --at most--.
In Col. 7, line 36, delete "volt-age" and insert --voltage--.
In Col. 7, line 37, delete "break-down" and insert --breakdown--.
In Col. 7, line 45, delete "care-fully" and insert --carefully--.
In Col. 7, line 55, delete "Al2O3" and insert --Al$_2$O$_3$--.

UNITED STATES PATENT AND TRADEMARK OFFICE
CERTIFICATE OF CORRECTION

PATENT NO.         : 7,414,257 B2
APPLICATION NO. : 10/812991
DATED              : August 19, 2008
INVENTOR(S)        : Happ et al.

It is certified that error appears in the above-identified patent and that said Letters Patent is hereby corrected as shown below:

In Col. 9, line 31, delete "staff" and insert --start--.
In Col. 9, line 65, delete $Al_2O_3$" and insert --$Al_2O_3$--.
In Col. 10, line 52, delete "off state" and insert --off-state--.

Signed and Sealed this

Eighteenth Day of November, 2008

JON W. DUDAS
*Director of the United States Patent and Trademark Office*